United States Patent
Inoue

(10) Patent No.: US 7,667,655 B2
(45) Date of Patent: Feb. 23, 2010

(54) ELECTROMAGNETIC INTERFERENCE PREVENTING COMPONENT AND ELECTRONIC DEVICE USING THE SAME

(75) Inventor: Tetsuo Inoue, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 314 days.

(21) Appl. No.: 11/911,764

(22) PCT Filed: Apr. 19, 2006

(86) PCT No.: PCT/JP2006/308183
§ 371 (c)(1),
(2), (4) Date: Oct. 17, 2007

(87) PCT Pub. No.: WO2006/112468
PCT Pub. Date: Oct. 26, 2006

(65) Prior Publication Data
US 2009/0040126 A1 Feb. 12, 2009

(30) Foreign Application Priority Data
Apr. 20, 2005 (JP) ............................. 2005-122739

(51) Int. Cl.
*H01Q 1/24* (2006.01)
(52) U.S. Cl. ...................... 343/702; 343/841
(58) Field of Classification Search ............... 343/702, 343/700 MS, 841
See application file for complete search history.

(56) References Cited
U.S. PATENT DOCUMENTS

2003/0107025 A1 6/2003 Okayama et al.
2004/0058138 A1 3/2004 Inazawa et al.
2004/0219328 A1 11/2004 Tasaki et al.
2005/0003079 A1 1/2005 Wakayama et al.
2005/0075150 A1 4/2005 Takagi et al.
2006/0045543 A1* 3/2006 Kato et al. ..................... 399/1
2006/0170583 A1* 8/2006 Palacios et al. ................ 342/1

FOREIGN PATENT DOCUMENTS

| CN | 1494372 A | 5/2004 |
| CN | 1522449 A | 8/2004 |
| EP | 1 274 293 A1 | 1/2003 |
| EP | 1 426 982 A1 | 6/2004 |
| EP | 1 460 656 A1 | 9/2004 |
| JP | 2002-158484 A | 5/2002 |
| JP | 2002-158486 A | 5/2002 |

(Continued)

*Primary Examiner*—HoangAnh T Le
(74) *Attorney, Agent, or Firm*—Foley & Lardner LLP

(57) ABSTRACT

An electromagnetic interference preventing component (18) includes a high-permeability magnetic film in high-frequency in which a real number component $\mu'$ of complex relative permeability at a transmission band frequency of an electronic device (10) incorporating the electromagnetic interference preventing component (18) is 10 or more, tan $\delta$ ($=\mu''/\mu'$) is 0.1 or less, and a ferromagnetic resonance frequency (fr) is 1.5 times or more of the transmission band frequency. The electromagnetic interference preventing component (18) having the high-permeability magnetic film in high-frequency is disposed in the electronic device (10) having an electromagnetic wave transmitting function, as to selectively decrease the electromagnetic field intensity in directions in which the electromagnetic waves radiated by an electromagnetic wave transmitting part such as an antenna (16) are not required.

20 Claims, 8 Drawing Sheets

FOREIGN PATENT DOCUMENTS

| | | | |
|---|---|---|---|
| JP | 2002-158488 A | 5/2002 | |
| JP | 2002-199077 A | 7/2002 | |
| JP | 2003-297629 A | 10/2003 | |
| JP | 2004-128001 A | 4/2004 | |
| JP | 2004-153807 A | 5/2004 | |
| JP | 2004-165620 A | 6/2004 | |
| JP | 2004-281814 A | 10/2004 | |
| TW | 541758 B | 7/2003 | |
| WO | WO 03/021610 A1 | 3/2003 | |

\* cited by examiner

[EXAMPLE 1]

[EXAMPLE 2]

[EXAMPLE 7]

[EXAMPLE 8]

[EXAMPLE 10]

[EXAMPLE 11]

[EXAMPLE 12]

[COMPARATIVE EXAMPLE 1]

ELECTROMAGNETIC INTERFERENCE PREVENTING COMPONENT AND ELECTRONIC DEVICE USING THE SAME

TECHNICAL FIELD

The present invention relates to an electromagnetic interference preventing component and an electronic device, such as a portable communication device, using the same.

BACKGROUND ART

In recent years, a portable communication device has made outstanding development, and particularly cellular phones are under rapid reduction in size, weight and thickness. Accordingly, an antenna positioned in the cellular phones and the like has come closer to a human head and other electronic devices susceptible to noise. Therefore, an interaction of the antenna with the human head or other electronic devices has become a subject of discussion.

Radio waves radiated from the antenna of the cellular phone are partially absorbed by the closest human head and the remaining radio waves are radiated to the air. Absorption of electromagnetic energy by the human head might cause a problem that the radiation efficiency and communication characteristics of the antenna are deteriorated. When the cellular phone is used, the antenna is close to the head, which is locally exposed to a strong electromagnetic field, so that adverse effects on a human body due to an increase in amount of power partial-body absorption are worried about. Therefore, guidelines (an amount of power partially absorbed per unit mass: SAR (Specific Absorption Rate)) for an electromagnetic energy partial-body absorption directed to the cellular phone have been set up in the U.S., Europe and Japan, consecutively.

Under the circumstances described above, the portable communication device represented by the cellular phone is desired to reduce the amount of electromagnetic energy absorbed by the human body (e.g., an exposure amount of the human head to electromagnetic energy). The exposure to the electromagnetic energy can be reduced by sufficiently increasing the distance between the antenna and the human body, but it is not a realistic solution to solve the problem because the cellular phone cannot be used if it is separated from the ear by a sufficient distance.

As a technology to decrease the level of an electromagnetic field generated around the antenna, it is known to dispose as an electromagnetic wave absorber a composite magnetic material containing soft magnetic powder and an organic binder or an inorganic binder at the antenna base or the like of the cellular phone (see, for example, Patent References 1 and 2). Here, the electromagnetic waves are consumed as heat loss by utilizing the fact that an imaginary component $\mu''$ of a complex relative permeability $\mu$ of the composite magnetic material rises steeply near the transmit frequency of the antenna.

Patent Reference 3 describes a granular magnetic film, which has ferromagnetic fine grains and a grain boundary substance formed of a metal oxide, a metal nitride or the like and arranged around them, as an electromagnetic wave absorption film which has the imaginary component $\mu''$ of the complex relative permeability $\mu$ in a gigahertz range enhanced. Patent Reference 4 describes an electromagnetic wave absorber that the real number component $\mu'$ and the imaginary component $\mu''$ of the complex relative permeability $\mu$ in a high-frequency region of 1 to 3 GHz meet the relationship of $\mu' > \mu''$.

Among the above electromagnetic field level reducing technologies, the technology which consumes the electromagnetic waves as a heat loss based on the imaginary component $\mu''$ of the complex relative permeability $\mu$ of the magnetic material has a disadvantage that the strength of a transmission signal itself lowers because of the reduction to the electromagnetic field level near the antenna. Patent Reference 1 describes that as a SAR suppressor application condition that the imaginary component $\mu''$ value of the complex relative permeability $\mu$ of the electromagnetic wave absorber is increased and a tan $\delta$ ($=\mu''/\mu'$) value is also increased.

For a conventional electromagnetic wave absorber that the imaginary component $\mu''$ of the complex relative permeability $\mu$ is larger than the real number component $\mu'$, a loss due to energy absorption cannot be disregarded. Therefore, it is necessary to find optimum values of an electromagnetic wave absorber adhering position, area and the like by experiments so that an energy loss can be minimized, namely an output drop of the electromagnetic waves radiated from the antenna is minimized. Therefore, a plan for improving the SAR suppression effect is merely described, and useful SAR measures have not been provided.

The electromagnetic wave absorber described in Patent Reference 4 suppresses a loss of electromagnetic waves by determining that the $\mu''$ having functions to absorb and attenuate the electromagnetic waves is decreased to be smaller than the $\mu'$ which does not contribute to the loss but relates to a magnitude of the complex relative permeability $\mu$. But, since a noise frequency is generally higher than the signal frequency, it is necessary to increase a resonant frequency sufficiently. And, fine particles have the shape anisotropy dispersed, and their aggregate, namely an electromagnetic wave absorber, becomes easy to allow the passage of a magnetic flux in a vertical direction. Therefore, there is a possibility that the magnetic flux is directly leaked through the component inserted between the human body and the antenna from the antenna to the human body via the interference preventing component.

[Patent Reference 1] JP-A 2002-158484 (KOKAI)
[Patent Reference 2] JP-A 2002-158488 (KOKAI)
[Patent Reference 3] JP-A 2002-158486 (KOKAI)
[Patent Reference 4] JP-A 2004-128001 (KOKAI)

SUMMARY OF THE INVENTION

The invention provides an electromagnetic interference preventing component that has made it possible to effectively decrease a strength (electromagnetic field intensity) of radiated electromagnetic waves in unnecessary directions while suppressing the decrease in strength of the signal transmitted from an electronic device such as a portable communication device and an electronic device using the same.

According to an aspect of the present invention, there is provided an electromagnetic interference preventing component which is mounted on an electronic device having an electromagnetic wave transmitting function, comprising a high-permeability magnetic film in high-frequency having a complex relative permeability $\mu$ at a transmission band frequency of the electronic device determined to have a real number component $\mu'$ and an imaginary component $\mu''$, wherein the $\mu'$ is 10 or more, tan $\delta$ ($=\mu''/\mu'$) is 0.1 or less, and a ferromagnetic resonance frequency of the high-permeability magnetic film is 1.5 times or more of the transmission band frequency.

According to another aspect of the present invention, there is provided an electronic device, comprising an electronic device body including an electromagnetic wave transmitting part, and an electromagnetic interference preventing component which is disposed to selectively decrease an electromagnetic field intensity in directions, in which electromagnetic waves radiate from the electromagnetic wave transmitting part are not required, the electromagnetic interference preventing component including a high-permeability magnetic film in high-frequency having a complex relative permeability t at a transmission band frequency of the electronic device body determined to have a real number component μ' and an imaginary component μ", wherein the μ' is 10 or more, tan δ (=μ"/μ') is 0.1 or less, and a ferromagnetic resonance frequency of the high-permeability magnetic film is 1.5 times or more of the transmission band frequency.

EXPLANATION OF NUMERALS

10: Cellular phone, 11: lower housing, 12: upper housing, 13: hinge, 14: circuit board, 15: keypad, 16: antenna, 17: display, 18: electromagnetic interference preventing component provided with high-permeability magnetic film in high-frequency, 20, 30: high-permeability magnetic film in high-frequency, 21, 31: nonmagnetic insulating substrate, 22: nonmagnetic insulating layer, 23: magnetic layer, 24: laminated film, 32: stripe-shaped magnetic film.

MODE FOR CARRYING OUT THE INVENTION

Figure 1:
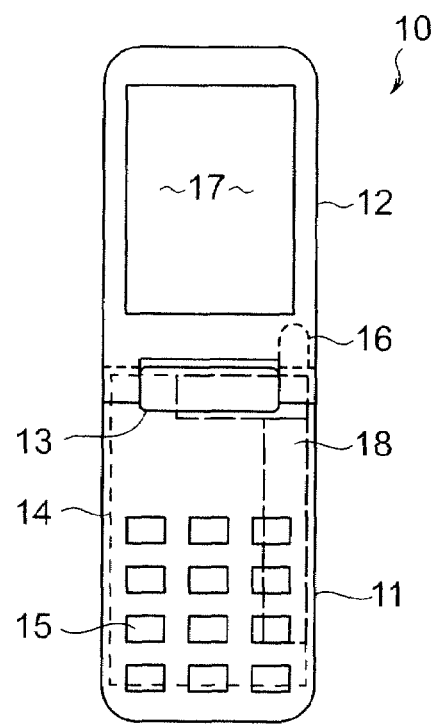
FIG. 1 is a front view showing a structure of the cellular phone according to an embodiment of the invention.
Figure 2:
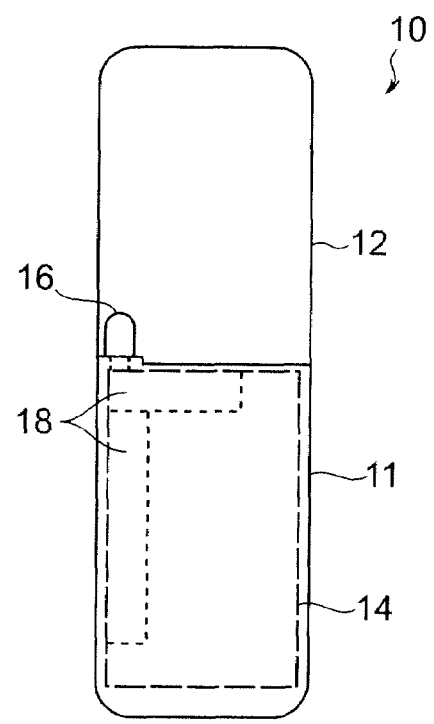
FIG. 2 is a back view of the cellular phone shown in FIG. 1.

Modes of conducting the present invention will be described below with reference to the drawings. First, an embodiment that the electronic device of the invention is applied to a cellular phone is described with reference to FIG. 1 and FIG. 2. FIG. 1 is a front view showing a schematic structure of the cellular phone according to the embodiment of the invention, and FIG. 2 is its back view. A foldable cellular phone 10 shown in these figures has a structure that a lower housing 11 and an upper housing 12 are pivotably coupled via a hinge 13.

The lower housing 11 includes a circuit board 14, on which a transmitting circuit, a receiving circuit, a switching circuit, a control circuit and the like are mounted, and has on its front surface an input keypad 15. The lower housing 11 has an antenna 16 as an electromagnetic wave transmitting part to send and receive radio signals (electromagnetic waves) including various types of data such as voice data, character data, image data and the like from the antenna 16. The antenna 16 is connected to the transmitting circuit and the receiving circuit through antenna wiring disposed on the circuit board 14. The upper housing 12 has a display 17 such as a liquid crystal display device or the like.

An electromagnetic interference preventing component 18 having a high-permeability magnetic film in high-frequency is disposed near the antenna 16 as the electromagnetic wave transmitting part. The electromagnetic interference preventing component 18 is disposed to selectively reduce the strength in directions in which the electromagnetic waves radiated from the antenna 16 and the antenna wiring of the circuit board 14 are not required, namely the electromagnetic field intensity with respect to the direction of the human head. Specifically, the electromagnetic interference preventing component 18 having a high-permeability magnetic film in high-frequency is disposed between the antenna 16 and the antenna wiring of the circuit board 14 and the surface (the surface having the keypad 15, unshown microphone, speaker and the like) of the lower housing 11 directed to the human body.

For example, the electromagnetic interference preventing component 18 disposed on the lower housing 11 is interposed between the human head and the antenna 16 and its nearby antenna wiring. The electromagnetic interference preventing component 18 according to this embodiment has a high-permeability magnetic film in high-frequency in which a real number component μ' of a complex relative permeability μ at a transmission band frequency of the cellular phone 10 is equal to or greater than 10, tan δ (=μ"/μ') is equal to or smaller than 0.1 and a ferromagnetic resonance frequency fr is equal to or greater than 1.5 times the transmission band frequency. The μ" is an imaginary component of the complex relative permeability μ at the transmission band frequency of the cellular phone 10. And, the complex relative permeability μ specified by the invention is a complex ratio permeability ($μ_r$).

A transmit frequency band of the portable communication device has a wide range as shown in Table 1, but the transmit frequency band, which is particularly significant in view of strength of electromagnetic waves (SAR) absorbed by the human body, is in a range of 824 MHz to 1980 MHz. In such a high-frequency region (e.g., a region to 2 GHz), a conventional electromagnetic interference preventing component does not have a sufficient μ', and electromagnetic waves are consumed as heat loss by using the μ" which rises steeply near the transmit frequency. The conventional electromagnetic interference preventing component does not use the μ' of the magnetic material but the μ" which is large in a GHz region. In other words, the conventional electromagnetic interference preventing component has used a magnetic material as the electromagnetic wave absorber.

TABLE 1

| Name | Transmission band MHz | |
| --- | --- | --- |
| AMPS | 824 | 849 |
| PCS (GSM1900) | 1851 | 1909 |
| GSM850 | 824 | 849 |
| GSM900 (EGSM) | 880 | 915 |
| DCS (GSM1800) | 1710 | 1785 |
| CDMA | 888 | 925 |
| PDC | 1429 | 1453 |
| W-CDMA (UMTS) | 1920 | 1980 |
| GPS | 1575.5 | — |
| BLue Tooth | 2400 | 2483.5 |

The electromagnetic interference preventing component 18 of this embodiment has the anisotropy field of a magnetic film increased to increase a ferromagnetic resonance frequency fr, thereby realizing the μ', which is large in a low frequency region, also large in a high-frequency region. The magnetic film showing such a large μ' in the high-frequency region is used as the electromagnetic interference preventing component 18, so that the electromagnetic waves which are radiated from the antenna 16 and the antenna wiring toward the human head can be lead upward or downward through the magnetic circuit of the high-permeability magnetic film in high-frequency. In other words, the electromagnetic field intensity of the air in which the human head is located can be decreased.

To selectively decrease the strength of the electromagnetic waves radiated toward the human head in the magnetic circuit based on the high-permeability magnetic film in high-frequency, the high-permeability magnetic film has a real number component μ' of a complex relative permeability μ at a transmission band frequency determined to be 10 or more. When the μ' of the high-permeability magnetic film is less than 10, the function as the magnetic circuit to lead the electromagnetic waves upward or downward cannot be obtained sufficiently. The μ' of the high-permeability magnetic film in high-frequency specified here has a transmission band frequency of the cellular phone 10 as a reference, but it is practically desirable that the real number component μ' of the complex relative permeability μ at 2 GHz is 10 or more. The μ' of the high-permeability magnetic film is more desirably 15 or more, and most desirably 30 or more.

The electromagnetic interference preventing component 18 having the high-permeability magnetic film in high-frequency showing a large μ' at the transmission band frequency (e.g., a region to 2 GHz) of the cellular phone 10 can be used to decrease the strength of unnecessary electromagnetic waves radiated toward the human head. In addition, since the ferromagnetic resonance frequency fr of the high-permeability magnetic film in high-frequency can be increased to decrease the μ", a loss of the electromagnetic waves due to the heat loss can be decreased. To obtain such a loss-reducing effect of the electromagnetic waves, the high-permeability magnetic film is determined that the imaginary component μ" to the real number component μ' of the complex relative permeability μ at a transmission band frequency has a ratio (μ"/μ'=tan δ) of 0.1 or less.

When the tan δ (=μ"/μ') exceeds 0.1, it means that the imaginary component μ" of the complex relative permeability μ at a transmission band frequency of the high-permeability magnetic film is large. The high-permeability magnetic film has an increased amount of consumption of the electromagnetic waves due to the heat loss similar to the conventional electromagnetic interference preventing component, so that the strength itself of the signal transmitted from the cellular phone 10 is degraded. The μ" of the high-permeability magnetic film in high-frequency specified here has a transmission band frequency of the cellular phone 10 as a reference, but the imaginary component μ" of the complex relative permeability μ at 2 GHz is desired to satisfy the above conditions from a practical standpoint.

In addition, the high-permeability magnetic film configuring the electromagnetic interference preventing component 18 is determined to have the ferromagnetic resonance frequency fr of 1.5 times or more the transmission band frequency in order to decrease the imaginary component μ" of the complex relative permeability μ at the transmission band frequency. If the ferromagnetic resonance frequency fr is less than 1.5 times the transmission band frequency, the μ" rises at a relatively low frequency, and a ratio (=tan δ) of the μ" to the μ' cannot be decreased sufficiently. In practice, the ferromagnetic resonance frequency fr of the high-permeability magnetic film in high-frequency is desirably 1.5 times or more the standard value which is determined to be 2 GHz.

For additional suppression of the loss resulting from the high-permeability magnetic film in high-frequency, it is desired to use in a frequency range in which the μ" does not rise substantially. Thus, the μ" at a transmission band frequency of the cellular phone 10 can be suppressed to a substantially negligible small level, so that the electromagnetic waves which are consumed as a heat loss can be further decreased by the high-permeability magnetic film. Accordingly, the ferromagnetic resonance frequency fr of the high-permeability magnetic film is more desirably 2 times or more the transmission band frequency. Thus, the antenna efficiency is further improved, and the strength of the electromagnetic waves radiated toward the human head and the like can be further decreased.

As described above, the electromagnetic interference preventing component 18 which has the high-permeability magnetic film in high-frequency, in which the real number component μ' of the complex relative permeability μ at a transmission band frequency of the cellular phone 10 is 10 or more, the tan δ (=μ"/μ') is 0.1 or less, and the ferromagnetic resonance frequency fr is 1.5 times or more of the transmission band frequency, is used, so that the strength of the electromagnetic waves radiated in unnecessary directions can be decreased effectively while suppressing the degradation of the strength of the signal transmitted from the cellular phone 10. Specifically, the electromagnetic field intensity of the air in which a human head and the like are positioned can be decreased effectively. Use of the electromagnetic interference preventing component 18 makes it possible to provide the portable communication device such as the cellular phone 10 and the like that both the improvement of the signal characteristics and the SAR measures are achieved.

The high-permeability magnetic film configuring the electromagnetic interference preventing component 18 is not limited to a particular composition or film structure if the above-described properties are satisfied. Magnetic films having various types of compositions and various types of magnetic structures satisfying the above-described properties can be applied because it is not influenced so much by the magnetic properties other than the μ', the μ"/μ' ratio and the fr, for example, properties such as a coercive force obtained by DC magnetic field measurement. The magnetic film structure is not particularly limited to an amorphous film, a heteroamorphous film, a crystalline film, a granular film, a nanocrystalline film and the like. To the high-permeability magnetic film in high-frequency, various types of magnetic films having the above magnetic structures and properties can be applied. The $\mu'$, the $\mu''/\mu'$ ratio, the fr and the like of the high-permeability magnetic film can be adjusted according to the film composition, film structure, film thickness, film shape (stripe shape or the like), film-forming conditions, heat treating conditions after the film formation and the like of the magnetic film.

As the high-permeability magnetic film in high-frequency, there is used, for example, a magnetic film having a composition which is represented by the general formula:

$$(T_xA_{100-x})_{100-y}D_y\ldots \quad (1)$$

where, T is at least one element selected from Fe, Co and Ni, A is at least one element selected from B, C, Si, P, Ge and Zr, D is an oxide of at least one element M1 selected from Si, Al, Zr and Hf or a nitride of at least one element M2 selected from Si and Al, and x and y are numbers meeting $50 \leqq x \leqq 100$ (atomic %) and $0 \leqq y < 50$ (atomic %).

In the above formula (1), the element T is an element responsible for magnetism and adjusts the composition ratio depending on the required magnetic properties. The element A is an element added to control a magnetic anisotropy, thermal stability, corrosion resistance and crystallization temperatures. A content of the element A is adjusted appropriately in a range of 50 atomic % or less with respect to a total amount of the element T and the element A. If the content of the element A exceeds 50 atomic %, the content of the element T lowers relatively, and there is a possibility that satisfactory magnetic properties cannot be obtained. The magnetic film may be composed of the element T and the element A only but may also contain a grain boundary substance formed of the compound D in order to control the magnetic anisotropy and the like.

The compound D composing a grain boundary substance is an insulator which is formed of an oxide of at least one element M1 selected from Si, Al, Zr and Hf or a nitride of at least one element M2 selected from Si and Al. Inclusion of such a grain boundary substance into the magnetic film can enhance the anisotropy field of the magnetic film. The content of the grain boundary substance is preferably adjusted such that the compound D has an atomic ratio y of 50% or less. If the atomic ratio y of the compound D exceeds 50%, the satisfactory properties of the magnetic film might not be obtained.

The high-permeability magnetic film in high-frequency is formed by applying, for example, a sputtering method, a vapor deposition method or the like. The magnetic film having the grain boundary substance formed of the compound D can be obtained by, for example, two-dimensional sputtering using a $T_xA_{100-x}$ composition alloy target and a target formed of the compound D. A specific target composition is prepared appropriately depending on the required properties, and various types of targets, such as an Fe—Co—B based target, an Fe—Co—Zr based target, an Fe—Co based target and an Fe based target, meeting the $T_xA_{100-x}$ composition can be used.

According to the two-dimensional sputtering, the composition and structure are adjusted by, for example, varying input power to the individual targets, and the various magnetic properties can be controlled accordingly. The target made of M1 or M2 may be used instead of the target made of the compound D to form the film by reactive sputtering in an oxygen atmosphere, a nitrogen atmosphere, a mixed atmosphere of oxygen and inert gas such as Ar, or a mixed atmosphere of nitrogen and inert gas such as Ar.

Figure 3:
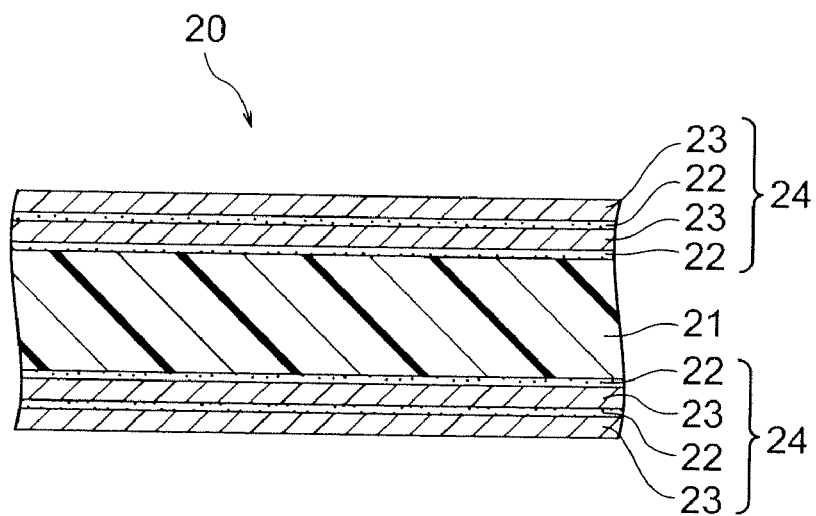
FIG. 3 is a sectional view showing a structure of the high-permeability magnetic film in high-frequency according to an embodiment of the invention.

To the high-permeability magnetic film in high-frequency, for example, either the single-layer film or the laminated film of the magnetic layer meeting the formula (1) can be applied. Especially, it is desirable to apply a magnetic film 20 having the laminated structure as shown in FIG. 3. The high-permeability magnetic film 20 shown in FIG. 3 has on a nonmagnetic insulating substrate 21 a laminated film 24 which has plural magnetic layers 23 laminated via a nonmagnetic insulating layer 22. FIG. 3 shows the high-permeability magnetic film 20 which has the laminated film 24 formed on either main side of the nonmagnetic insulating substrate 21. The laminated film 24 may be formed only on one of the main sides of the nonmagnetic insulating substrate 21.

The high-frequency magnetic properties of the magnetic film are affected by the film thickness, and if the film thickness is excessively large, the magnetic properties are deteriorated by the skin effect caused by an eddy current. The imaginary component $\mu''$ of the complex relative permeability $\mu$ in the high-frequency region becomes large with the increase in film thickness of the magnetic film. Therefore, the magnetic layers 23 are preferably laminated via the nonmagnetic insulating layer 22 to keep the film thicknesses of the individual magnetic layers 23 small. The film thickness of the each magnetic layer 23 is preferably 1 $\mu$m or less, and more preferably 0.5 $\mu$m or less. The thickness of the nonmagnetic insulating layer 22 can be adjusted appropriately within a range that the magnetic properties of the high-permeability magnetic film 20 are not deteriorated.

The laminated number of the magnetic layers 23 is preferably determined considering the effect obtained by using the high-permeability magnetic film 20 as the electromagnetic interference preventing component 18. In other words, the effect of reducing the electromagnetic field intensity in the unnecessary directions by the electromagnetic interference preventing component 18 is affected by the total film thickness of the magnetic film as a whole. If the high-permeability magnetic film 20 has an excessively small magnetic film thickness, its function as the magnetic circuit to guide the electromagnetic waves in a desired direction is deteriorated. The magnetic film thickness (=the single-layer film thickness of individual magnetic layers 23×the laminated number) of the high-permeability magnetic film 20 corresponding to the total sum of the single-layer film thickness of the each magnetic layer 23 is preferably determined to be larger than 1 $\mu$m, and more preferably 2 $\mu$m or more.

For the high-permeability magnetic film in high-frequency, for example, a magnetic film which has an anisotropy field enhanced based on induced magnetic anisotropy or shape magnetic anisotropy and is provided with uniaxial magnetic anisotropy accordingly is used. In a case where the high-permeability magnetic film is mainly provided with the anisotropy field based on the induced magnetic anisotropy, it is preferable to apply a granular magnetic film having a composition with the y value of the formula (1) in a range of 10 to 50 atomic %. The anisotropy field based on the induced magnetic anisotropy can be enhanced with a good reproducibility by forming the magnetic film in a magnetic field or performing the heat treatment in a magnetic field after the film is formed. But, the composition of the magnetic film is not limited to the above-described composition but may be sufficient if it can provide the induced magnetic anisotropy by performing the film formation in a magnetic field or the heat treatment in a magnetic field.

Figure 4:
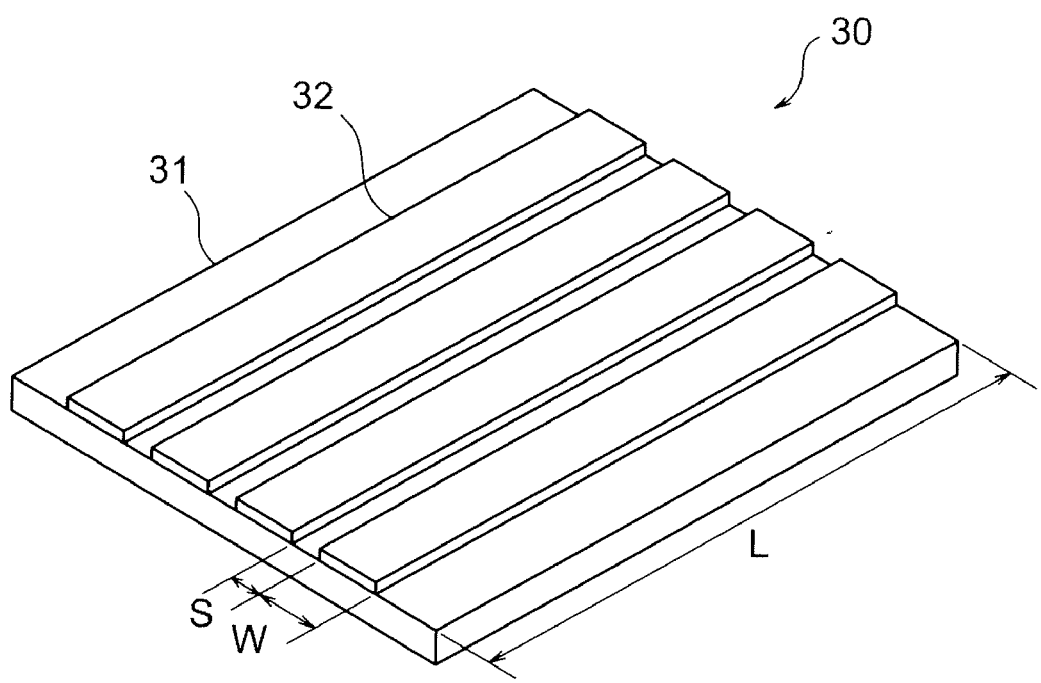
FIG. 4 is a perspective view showing a structure of the high-permeability magnetic film in high-frequency according to another embodiment of the invention.

In a case where the high-permeability magnetic film in high-frequency is provided with an anisotropy field mainly based on the shape magnetic anisotropy, the magnetic film is preferably patterned into a stripe shape as shown in FIG. 4. A high-permeability magnetic film 30 shown in FIG. 4 is provided with a magnetic film 32 which is formed on a nonmagnetic insulating substrate (support substrate) 31, and the magnetic film 32 has a stripe shape.

To induce the shape magnetic anisotropy in the magnetic film 32, it is preferable that a stripe width W is in a range of 10 to 500 μm, a stripe space S is in a range of 5 to 100 μm, and a length L is 10 mm or more. The length L of the stripe-shaped magnetic films 32 is preferably in a range of 10 to 70 mm from a practical standpoint. If the length L is less than 10 mm, there is a possibility that the satisfactory effect of forming the stripe shape cannot be obtained. Meanwhile, if the length L exceeds 70 mm, the high-permeability magnetic film in high-frequency becomes large, and its mounting in the cellular phone 10 or the like becomes difficult.

It is needless to say that the anisotropy field of the high-permeability magnetic film in high-frequency is not limited to one of the induced magnetic anisotropy and the shape magnetic anisotropy, but both of them may be used. For example, a magnetic film having a composition that the induced magnetic anisotropy is readily induced can be patterned into a stripe shape to additionally enhance the anisotropy field. And, in a case where either the induced magnetic anisotropy or the shape magnetic anisotropy is used, it is preferable that the high-permeability magnetic film in high-frequency has the magnetic film 20 having the laminated structure shown in FIG. 3. The single-layer film thickness of the each magnetic layer and the total film thickness of the laminated film are as described above.

The example of disposing the electromagnetic interference preventing component 18 to decrease the electromagnetic field intensity of the air where the human head is located was described in the above-described embodiment. But, the air where the electromagnetic field intensity is decreased is not limited to the above. The electromagnetic interference preventing component 18 also functions effectively to decrease the electromagnetic field intensity of the air where other electronic parts and electronic devices (e.g., camera parts and the like of the cellular phone) susceptible to noise are disposed. The example of applying the electronic device of the invention to the cellular phone was described, but the electronic device of the invention is not limited to it. The invention can be applied to various types of electronic devices having an electromagnetic wave transmitting function represented by the portable communication device.

Specific examples of the invention and their evaluated results will be described below.

EXAMPLE 1

A target having 20 $SiO_2$ chips (10 mm×10 mm×2.3 mm) uniformly positioned on an erosion pattern of a disk-shaped alloy target having an $Fe_{50}Co_{35}B_{15}$ composition, a diameter of 125 mm and a thickness of 3 mm was used to form a magnetic film by an RF magnetron sputtering apparatus. To form the magnetic film, it was determined that an applied power was 3.3 W/cm$^2$, a target-to-substrate distance was 75 mm, and an argon pressure was 3.2 Pa (500 SCCM). A magnetic field of 1.6×10$^4$ A/m was applied in a direction perpendicular to the normal of the substrate when the film was formed. The obtained magnetic film (FeCoBSiO film) had a composition $(Fe_{50}Co_{35}B_{15})_{70}(SiO_2)_{30}$ (atomic %) in which amorphous magnetic particles of the $Fe_{50}Co_{35}B_{15}$ composition having a diameter of about 200 nm were dispersed into an $SiO_2$ mother phase.

A high-permeability magnetic film in high-frequency was formed by alternately laminating the FeCoBSiO film which was formed by using the above-described composite target and had a thickness of 0.5 μm and an $SiO_2$ film which was formed by using an $SiO_2$ target and had a thickness of 0.05 μm on either side of a polyimide substrate having a thickness of 100 μm. The above films were laminated on either surface two times. The high-permeability magnetic film in high-frequency was provided with a uniaxial magnetic anisotropy based on the induced magnetic anisotropy. The high-permeability magnetic film had a film structure [(FeCoBSiO film (0.5 μm)/$SiO_2$ film (0.05 μm))$_2$//polyimide substrate (100 μm)//(FeCoBSiO film (0.5 μm)/$SiO_2$ film (0.05 μm))$_2$]. The film composition and film structure are shown in Table 2.

Figure 5:
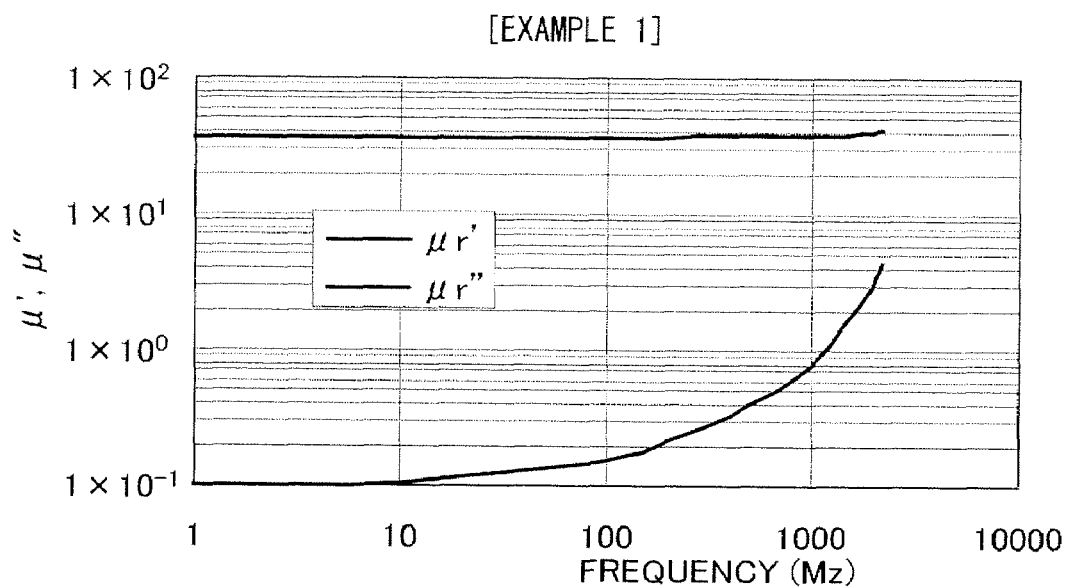
FIG. 5 is a diagram showing frequency dependencies of μ' and μ" of the high-permeability magnetic film in high-frequency according to Example 1 of the invention.

The above-described high-permeability magnetic film was measured for magnetic properties to find that a saturation magnetic field Ms was 1.4 T, an anisotropy field Hk was 3.0×10$^4$ A/m, and a ferromagnetic resonance frequency fr was 3500 MHz. The high-permeability magnetic film was measured for frequency dependencies of μ' and μ". The results are shown in FIG. 5. It is apparent from FIG. 5 that the high-permeability magnetic film has a large μ' value not only in a low frequency range but also in a high frequency range, and a small μ" value in the high frequency range. A μ"/μ' ratio of the high-permeability magnetic film at 2 GHz is 0.08. The film properties are shown in Table 3. The high-permeability magnetic film in high-frequency was subjected to the property evaluation to be described later.

EXAMPLE 2

Figure 6:
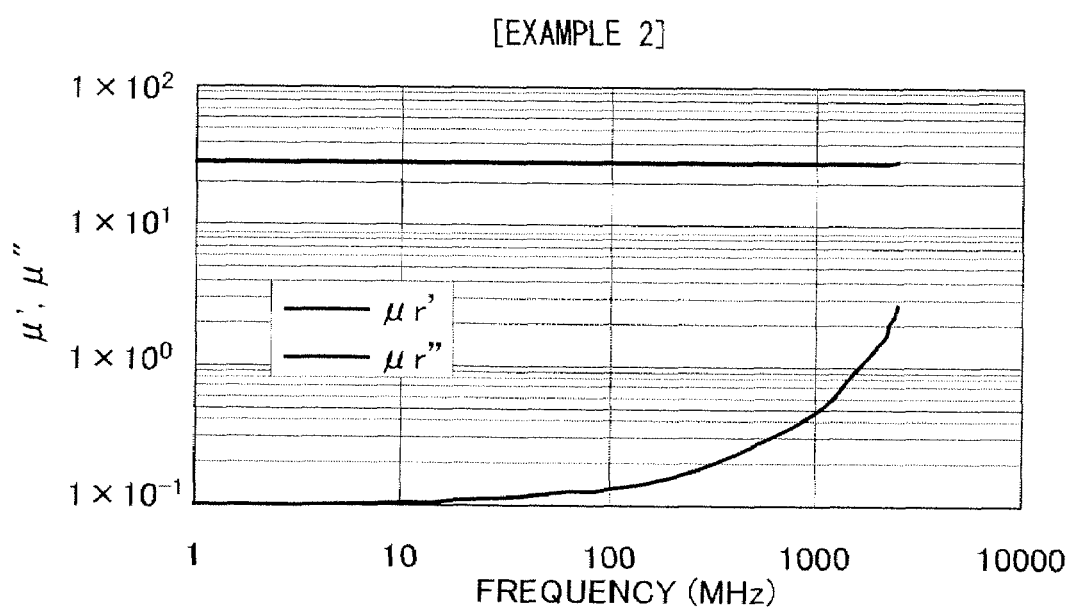
FIG. 6 is a diagram showing frequency dependencies of μ' and μ" of the high-permeability magnetic film in high-frequency according to Example 2 of the invention.

A high-permeability magnetic film in high-frequency having the same structure as in Example 1 was produced in the same manner as in Example 1 excepting that the magnetic film (FeCoBSiO film) formed in Example 1 was heated to 270° C. in a DC magnetic field of 400 kA/m in a nitrogen atmosphere. The film composition and film structure are shown in Table 2. The high-permeability magnetic film was measured for magnetic properties to find that a saturation magnetic field Ms was 1.4 T, an anisotropy field Hk was 4.0×10$^4$ A/m, and a ferromagnetic resonance frequency fr was 3700 MHz. The high-permeability magnetic film was measured for frequency dependencies of μ' and μ". The results are shown in FIG. 6. It is apparent from FIG. 6 that the high-permeability magnetic film had a smaller μ" value at 2 GHz. A μ"/μ' ratio at 2 GHz was 0.04. The high-permeability magnetic film in high-frequency was subjected to the property evaluation to be described later.

EXAMPLE 3

Figure 7:
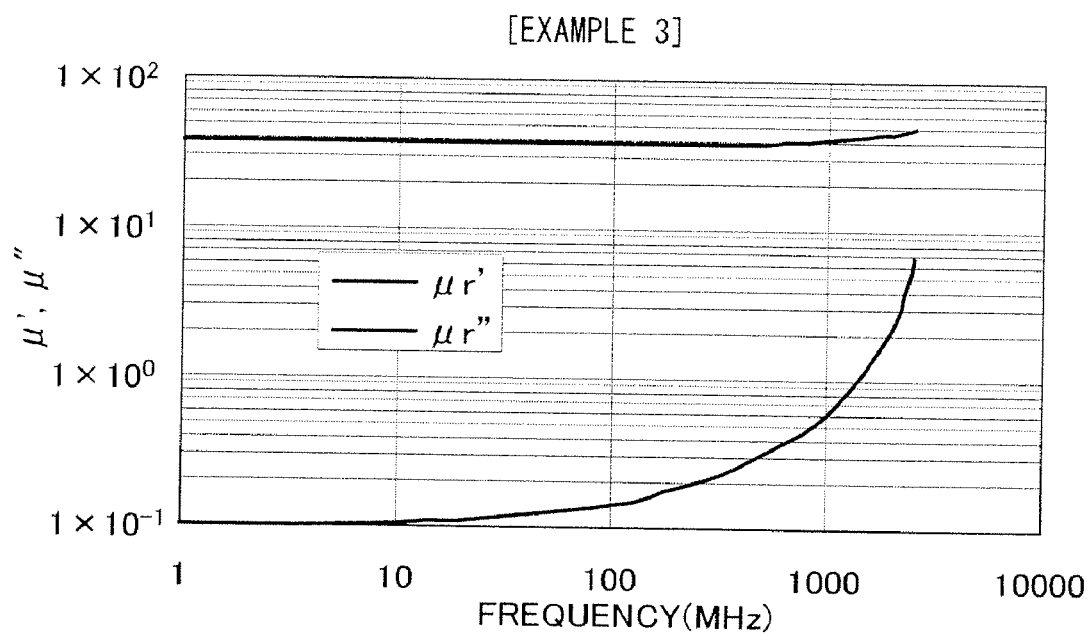
FIG. 7 is a diagram showing frequency dependencies of μ' and μ" of the high-permeability magnetic film in high-frequency according to Example 3 of the invention.

A high-permeability magnetic film in high-frequency was produced in the same manner as in Example 1 excepting that the magnetic film (FeCoBSiO film) of Example 1 was determined to have a single-layer film thickness of 0.3 μm. The high-permeability magnetic film had a film structure [(FeCoBSiO film (0.3 μm)/$SiO_2$ film (0.05 μm))$_2$//polyimide substrate (100 μm)//(FeCoBSiO film (0.3 μm)/$SiO_2$ film (0.05 μm))$_2$]. The film composition and film structure are shown in Table 2. The high-permeability magnetic film was measured for magnetic properties. The measured results are shown in Table 3. Frequency dependencies of μ' and μ" of the high-permeability magnetic film are shown in FIG. 7. The high-permeability magnetic film in high-frequency was subjected to the property evaluation to be described later.

EXAMPLE 4

A high-permeability magnetic film in high-frequency was produced in the same manner as in Example 1 except that the magnetic film (FeCoBSiO film) of Example 1 was laminated on each side three times. The high-permeability magnetic film had a film structure [(FeCoBSiO film (0.5 μm)/SiO$_2$ film (0.05 μm))$_3$//polyimide substrate (100 vm)//(FeCoBSiO film (0.5 μm)/SiO$_2$ film (0.05 μm))$_3$]. The film composition and film structure are shown in Table 2. The high-permeability magnetic film was measured for magnetic properties. The measured results are shown in Table 3. The high-permeability magnetic film in high-frequency was subjected to the property evaluation to be described later.

EXAMPLE 5

A high-permeability magnetic film in high-frequency was produced in the same manner as in Example 1 except that the magnetic film (FeCoBSiO film) of Example 1 was determined to be a single-layer film. The high-permeability magnetic film had a film structure [FeCoBSiO film (0.5 μm)/SiO$_2$ film (0.05 μm)//polyimide substrate (100 μm)//SiO$_2$ film (0.05 μm)/FeCoBSiO film(0.5 μm)]. The film composition and film structure are shown in Table 2. The high-permeability magnetic film was measured for magnetic properties. The measured results are shown in Table 3. The high-permeability magnetic film in high-frequency was subjected to the property evaluation to be described later.

EXAMPLE 6

A laminated film formed in the same manner as in Example 1 was subjected to ion milling to pattern into the stripe shape as shown in FIG. 4. The pattern shape had a stripe width W of 75 μm, a stripe space S of 25 μm and a length L of 40 mm. Thus, a high-permeability magnetic film in high-frequency having induced the shape magnetic anisotropy based on patterning into the stripe shape in addition to the induced magnetic anisotropy based on the magnetic film composition and structure was produced.

Figure 8:
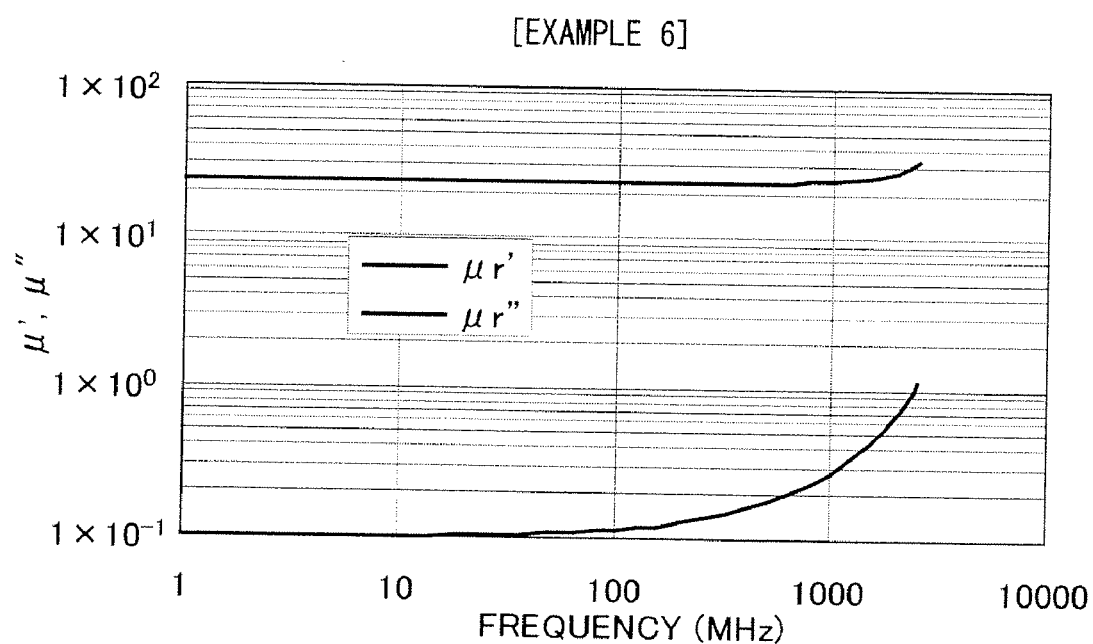
FIG. 8 is a diagram showing frequency dependencies of μ' and μ" of the high-permeability magnetic film in high-frequency according to Example 6 of the invention.

The magnetic properties of the high-permeability magnetic film having the above-described induced magnetic anisotropy and shape magnetic anisotropy were measured with a magnetic field applied in a minor axial direction (stripe width direction) of the magnetic film. As a result, it was found that a saturation magnetic field Ms was 1.1 T, an anisotropy field Hk was 4.8×10$^4$ A/m, and a ferromagnetic resonance frequency fr was 4000 MHz. Frequency dependencies of μ' and μ" were measured. The results are shown in FIG. 8. It is apparent from FIG. 8 that the high-frequency high-permeability had a smaller μ" value at 2 GHz. A μ"/μ' ratio at 2 GHz was 0.02. The high-permeability magnetic film in high-frequency was subjected to the property evaluation to be described later.

EXAMPLE 7

A target having 20 SiO$_2$ chips (10 mm×10 mm×2.3 mm) uniformly positioned on an erosion pattern of a disk-shaped alloy target having an Fe$_{68}$Co$_{17}$Zr$_{15}$ composition, a diameter of 125 mm and a thickness of 3 mm was used to form a magnetic film by an RF magnetron sputtering apparatus. To form the magnetic film, it was determined that an applied power was 3.3 W/cm$^2$, a target-to-substrate distance was 75 mm, and an argon pressure was 3.2 Pa (500 SCCM). A magnetic field of 1.6×10$^4$ A/m was applied in a direction perpendicular to the normal of the substrate to form the film. The obtained magnetic film (FeCoZrSiO film) had a composition (Fe$_{68}$Co$_{17}$Zr$_{15}$)$_{69}$(SiO$_2$)$_{31}$(atomic %) in which amorphous magnetic particles of the Fe$_{68}$Co$_{17}$Zr$_{15}$ composition having a diameter of about 200 nm were dispersed into an SiO$_2$ mother phase.

A film was formed on either side of a polyimide substrate having a thickness of 100 μm, and an FeCoZrSiO film which was formed by using the above-described composite target to have a thickness of 0.5 μm and an SiO$_2$ film which was formed by using an SiO$_2$ target to have a thickness of 0.05 μm were alternately formed. The repeatedly laminated number was four times on either side of the substrate. The laminated film (sputtered film) had a structure [(FeCoZrSiO film (0.5 μm)/SiO$_2$ film (0.05 μm))$_4$//polyimide substrate (100 μm)//(FeCoZrSiO film (0.5 μm)/SiO$_2$ film (0.05 μm))$_4$].

Figure 9:
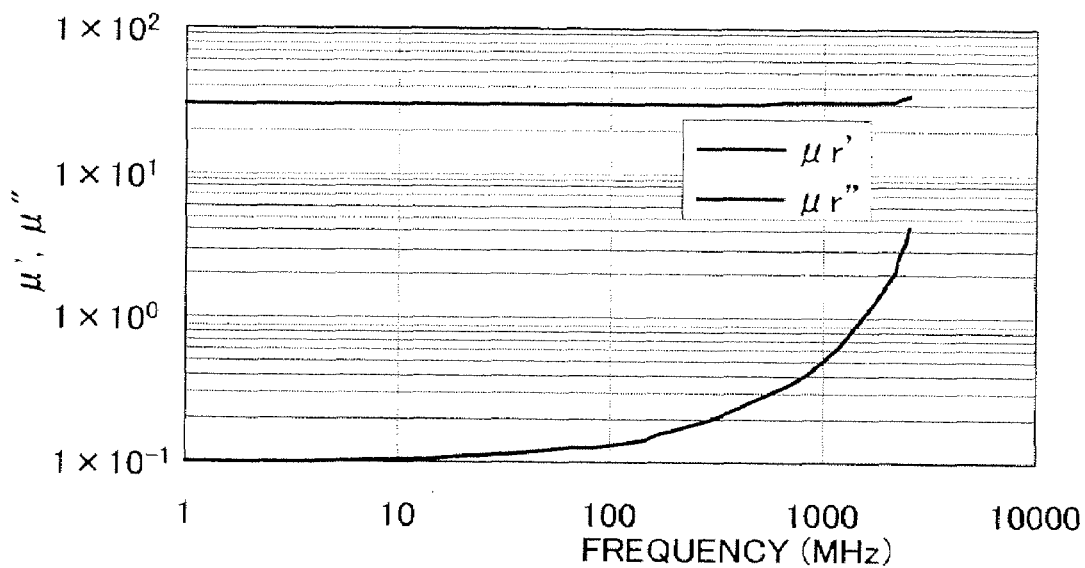
FIG. 9 is a diagram showing frequency dependencies of μ' and μ" of the high-permeability magnetic film in high-frequency according to Example 7 of the invention.

The obtained laminated film was subjected to ion milling to pattern into the stripe shape as shown in FIG. 4. The pattern shape had a stripe width W of 15 μm, a stripe space S of 5 μm and a length L of 40 mm. Thus, a high-permeability magnetic film in high-frequency having the shape magnetic anisotropy induced based on the patterning into the stripe shape was produced. The film composition and film structure are shown in Table 2. The high-permeability magnetic film was also measured for magnetic properties. The measured results are shown in Table 3. Frequency dependencies of μ' and μ" of the high-permeability magnetic film are shown in FIG. 9. The obtained high-permeability magnetic film in high-frequency was subjected to the property evaluation to be described later.

EXAMPLE 8

Figure 10:
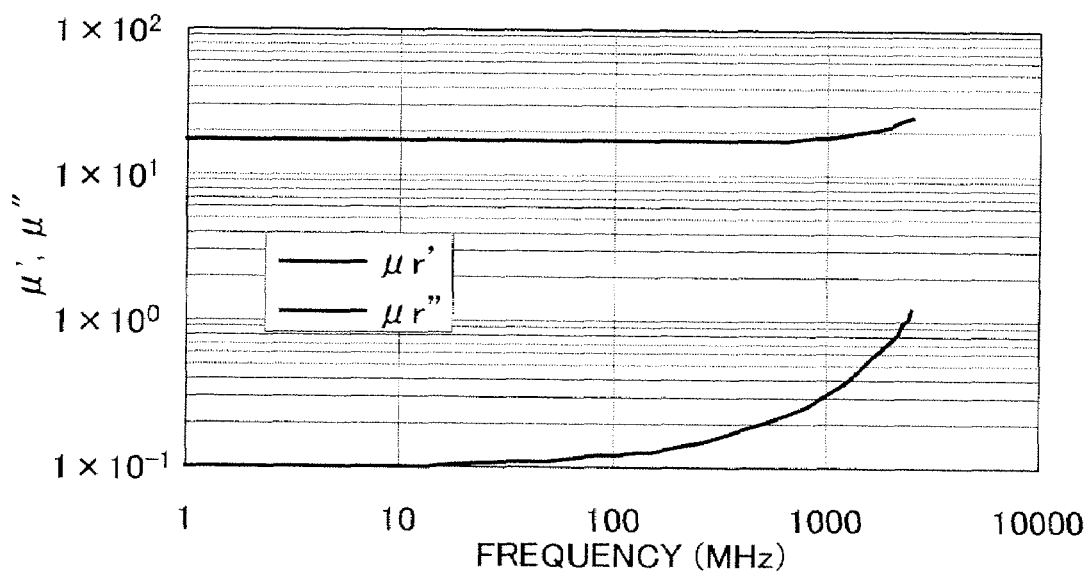
FIG. 10 is a diagram showing frequency dependencies of μ' and μ" of the high-permeability magnetic film in high-frequency according to Example 8 of the invention.

A high-permeability magnetic film in high-frequency having the same structure as in Example 7 was produced in the same manner as in Example 7 excepting that the formed magnetic film (FeCoZrSiO film) of Example 7 was heated to 250° C. in a DC magnetic field of 400 kA/m in a nitrogen atmosphere. The film composition and film structure are shown in Table 2. The high-permeability magnetic film was measured for magnetic properties. The measured results are shown in Table 3. Frequency dependencies of μ' and μ" of the high-permeability magnetic film are shown in FIG. 10. The obtained high-permeability magnetic film in high-frequency was subjected to the property evaluation to be described later.

EXAMPLE 9

A high-permeability magnetic film in high-frequency was produced in the same manner as in Example 7 except that the laminated number on one side of the magnetic film (FeCoZrSiO film) of Example 7 was determined to be two times. The high-permeability magnetic film had a film structure [(FeCoZrSiO film (0.5 μm)/SiO$_2$ film (0.05 μm))$_2$//polyimide substrate (100 μm)//(FeCoZrSiO film (0.5 μm)/SiO$_2$ film (0.05 μm))$_2$]. The film composition and film structure are shown in Table 2. The high-permeability magnetic film was measured for magnetic properties. The measured results are shown in Table 3. The obtained high-permeability magnetic film in high-frequency was subjected to the property evaluation to be described later.

EXAMPLE 10

A disk-shaped alloy target having an Fe$_{80}$Co$_{20}$ composition, a diameter of 125 mm and a thickness of 3 mm and an SiO$_2$ target were used to form a film by an RF magnetron sputtering apparatus. An Fe$_{80}$Co$_{20}$ film having a thickness of 0.5 μm and an SiO$_2$ film having a thickness of 0.05 μm were alternately formed on either side of a polyimide substrate having a thickness of 100 μm. To form the magnetic film, it was determined that an applied power was 3.3 W/cm$^2$, a target-to-substrate distance was 75 mm, and an argon pressure was 1.6 Pa (500 SCCM). A magnetic field was not applied when the magnetic film was formed.

The above-described laminated film (sputtered film) had a structure [(Fe$_{80}$Co$_{20}$ film (0.5 μm)/SiO$_2$ film (0.05 μm))$_4$//polyimide substrate (100 μm)//(Fe$_{80}$Co$_{20}$ film (0.5 μm)/SiO$_2$ film (0.05 μm))$_4$]. The laminated film was subjected to ion milling to pattern into the stripe shape as shown in FIG. 4. The pattern shape had a stripe width W of 75 μm, a stripe space S of 25 μm and a length L of 40 mm. Thus, a high-permeability magnetic film having the induced shape magnetic anisotropy based on the patterning into the stripe shape was produced.

Figure 11:
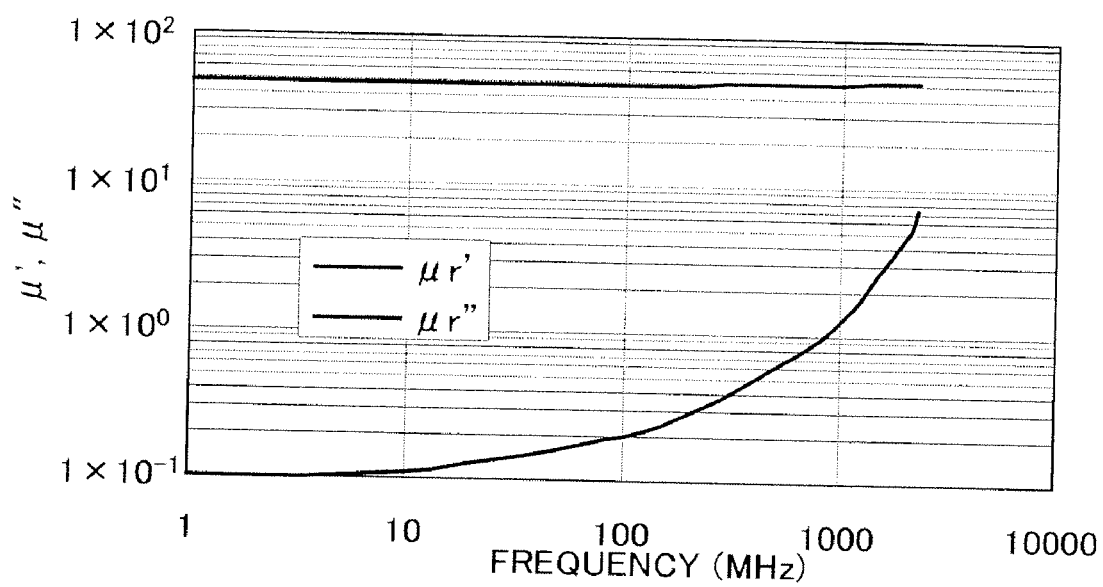
FIG. 11 is a diagram showing frequency dependencies of μ' and μ" of the high-permeability magnetic film in high-frequency according to Example 10 of the invention.

The high-permeability magnetic film was measured for magnetic properties with a magnetic field applied in a minor axial direction of the magnetic film. As a result, it was found that a saturation magnetic field Ms was 1.7 T, an anisotropy field Hk was 2.8×10$^4$ A/m, and a ferromagnetic resonance frequency fr was 3500 MHz. Frequency dependencies of μ' and μ" were also measured. The results are shown in FIG. 11. It is apparent from FIG. 11 that the high-permeability magnetic film had a large μ' value not only in a low frequency range but also in a high frequency range, and the μ" value was small in a high frequency range. A μ"/μ' ratio at 2 GHz was 0.09. The high-permeability magnetic film in high-frequency was subjected to the property evaluation to be described later.

EXAMPLE 11

Figure 12:
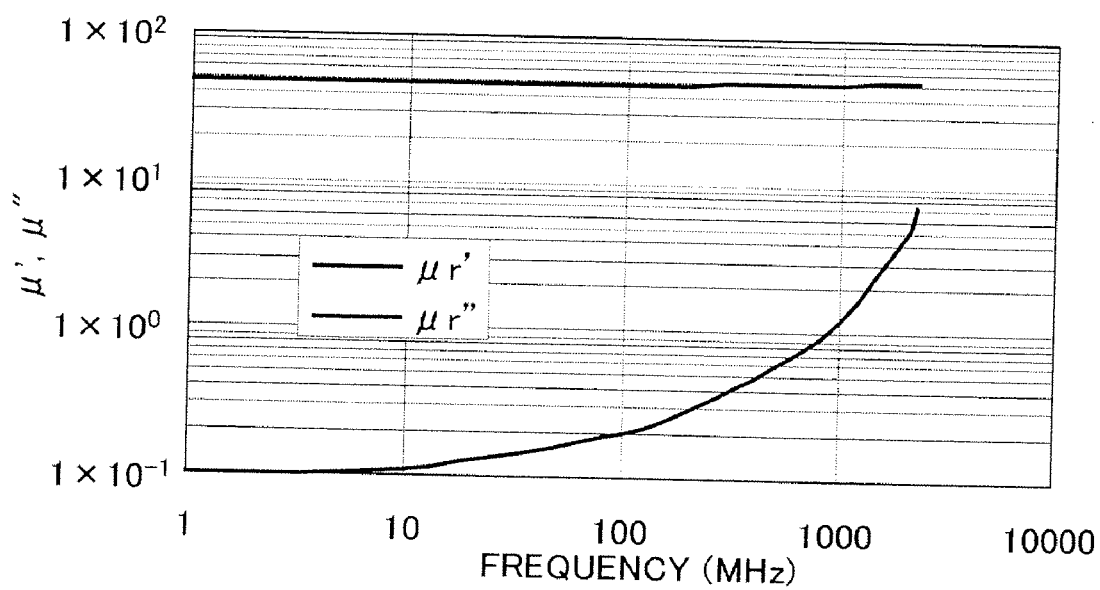
FIG. 12 is a diagram showing frequency dependencies of μ' and μ" of the high-permeability magnetic film in high-frequency according to Example 11 of the invention.

A high-permeability magnetic film in high-frequency was produced in the same manner as in Example 10 excepting that the magnetic film (Fe$_{80}$Co$_{20}$ film) of Example 10 was determined to have a single-layer film thickness of 1 μm. The high-permeability magnetic film had a film structure [(Fe$_{80}$Co$_{20}$ film (1 μm)/SiO$_2$ film (0.05 μm))$_4$//polyimide substrate (100 μm)//(Fe$_{80}$Co$_{20}$ film (1 μm)/SiO$_2$ film (0.05 μm))$_4$]. The film composition and film structure are shown in Table 2. The high-permeability magnetic film was measured for magnetic properties. The measured results are shown in Table 3. Frequency dependencies of μ' and μ" of the high-permeability magnetic film are shown in FIG. 12. The high-permeability magnetic film in high-frequency was subjected to the property evaluation to be described later.

EXAMPLE 12

Figure 13:
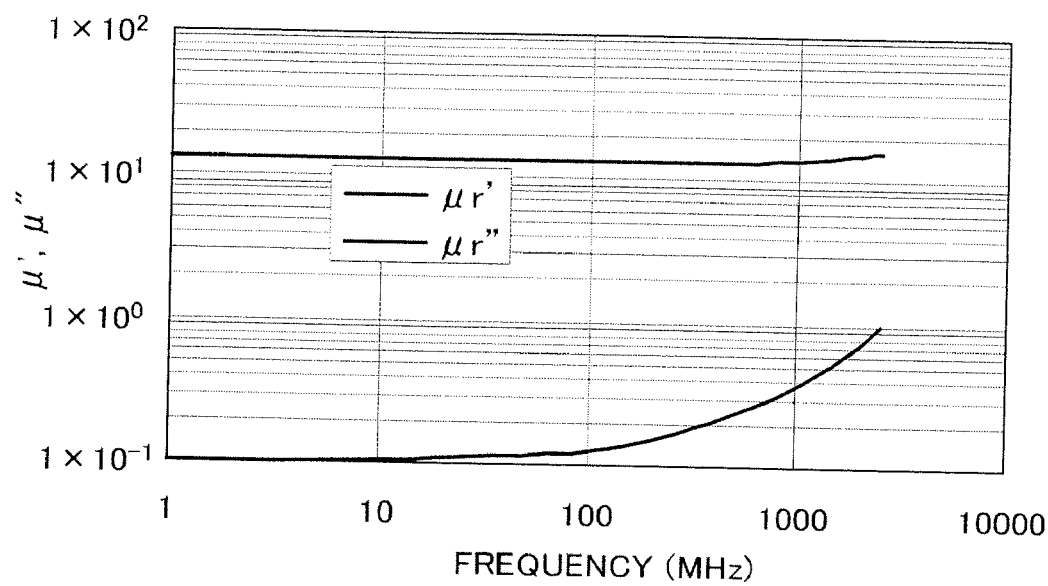
FIG. 13 is a diagram showing frequency dependencies of μ' and μ" of the high-permeability magnetic film in high-frequency according to Example 12 of the invention.

A high-permeability magnetic film in high-frequency was produced in the same manner as in Example 10 excepting that the laminated film of Example 10 was determined to have a pattern shape with a stripe width W of 25 μm, a stripe space S of 10 μm and a length L of 40 mm. The film composition and film structure are shown in Table 2. The high-permeability magnetic film was measured for magnetic properties. The measured results are shown in Table 3. Frequency dependencies of μ' and μ" of the high-permeability magnetic film are shown in FIG. 13. The high-permeability magnetic film in high-frequency was subjected to the property evaluation to be described later.

COMPARATIVE EXAMPLE 1

A target having 15 SiO$_2$ chips (10 mm×10 mm×2.3 mm) uniformly positioned on an erosion pattern of a disk-shaped alloy target having a Co$_{55}$Fe$_{30}$B$_{15}$ composition, a diameter of 125 mm and a thickness of 3 mm was used to form a film by an RF magnetron sputtering apparatus. To form the magnetic film, it was determined that an applied power was 3.3 W/cm$^2$, a target-to-substrate distance was 75 mm, and an argon pressure was 3.2 Pa (500 SCCM). A magnetic field of 1.6×10$^4$ A/m was applied in a direction perpendicular to the normal of the substrate when the film was formed. The obtained magnetic film (CoFeBSiO film) had a composition (Co$_{55}$Fe$_{30}$B$_{15}$)$_{79}$(SiO$_2$)$_{21}$ (atomic %).

A CoFeBSiO film which was formed to have a thickness of 0.5 μm by using the above-described composite target and an SiO$_2$ film which was formed to have a thickness of 0.05 μm by using an SiO$_2$ target were alternately formed on either side of a polyimide substrate having a thickness of 100 μm. The films were repeatedly laminated on either side four times. The laminated film (sputtered film) had a structure [(CoFeBSiO film (0.5 μm)/SiO$_2$ film (0.05 μm))$_4$//polyimide substrate (100 μm)//(CoFeBSiO film (0.5 μm)/SiO$_2$ film (0.05 μm))$_4$].

Figure 14:
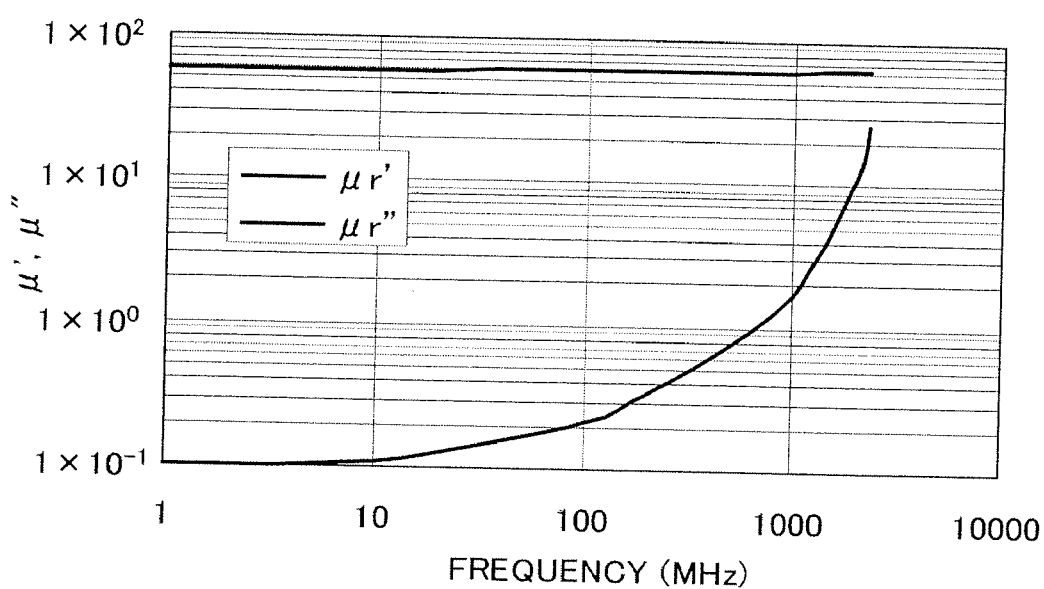
FIG. 14 is a diagram showing frequency dependencies of μ' and μ" of the magnetic film according to Comparative Example 1.

The obtained laminated magnetic film was measured for magnetic properties to find that a saturation magnetic field Ms was 1.5 T, an anisotropy field Hk was 2.0×10$^4$ A/m, and a ferromagnetic resonance frequency fr was 2200 MHz. Frequency dependencies of μ' and μ" of the magnetic film were also measured. The measured results are shown in FIG. 14. It is apparent from FIG. 14 that the μ" of the magnetic film rises at a relatively low frequency range, and a μ"/μ' ratio at 2 GHz was 0.17.

COMPARATIVE EXAMPLE 2

A laminated magnetic film was produced in the same manner as in Example 10 excepting that the magnetic film (Fe$_{80}$Co$_{20}$ film) of Example 10 was determined to have a single-layer film thickness of 1.5 μm. The laminated magnetic film had a film structure [(Fe$_{80}$Co$_{20}$ film (1.5 μm)/SiO$_2$ film (0.05 μm))$_4$//polyimide substrate (100 μm)//(Fe$_{80}$Co$_{20}$ film (1.5 μm)/SiO$_2$ film (0.05 μm))$_4$]. The film composition and film structure are shown in Table 2.

Figure 15:
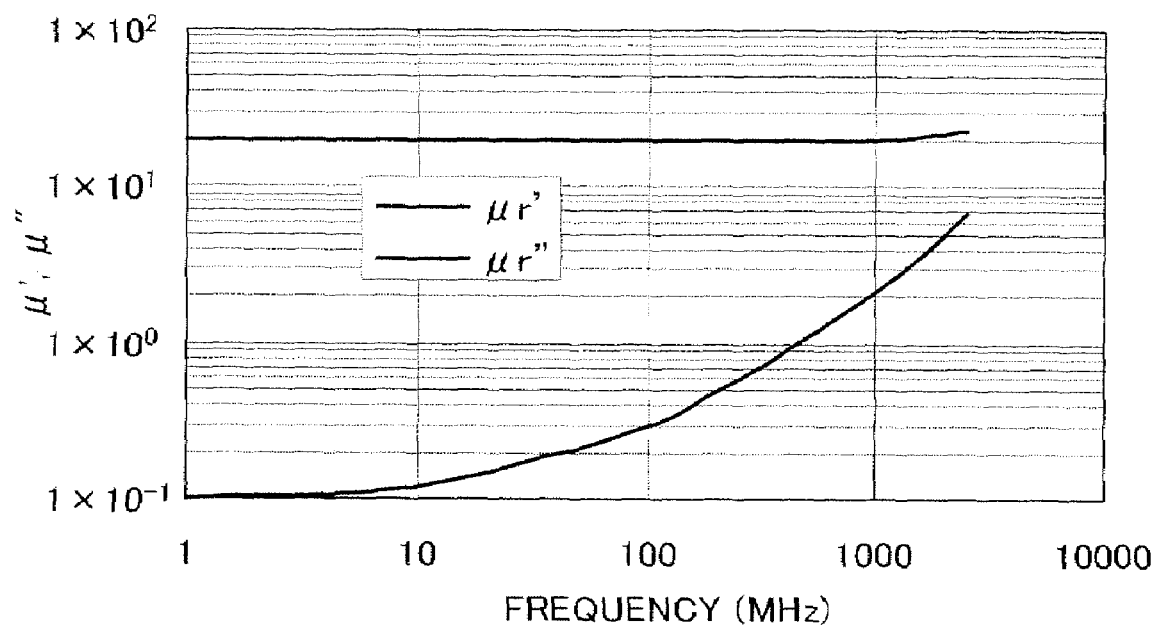
FIG. 15 is a diagram showing frequency dependencies of μ' and μ" of the magnetic film according to Comparative Example 2.

The above-described magnetic film was measured for magnetic properties to find that a saturation magnetic field Ms was 1.7 T, an anisotropy field Hk was 6.9×10$^4$ A/m, and a ferromagnetic resonance frequency fr was 5400 MHz. Frequency dependencies of μ' and μ" of the magnetic film were also measured. The measured results are shown in FIG. 15. It is apparent from FIG. 15 that the μ" of the magnetic film rises at a relatively low frequency range, and a μ"/μ' ratio at 2 GHz was 0.22.

COMPARATIVE EXAMPLE 3

A laminated magnetic film was produced in the same manner as in Example 10 excepting that the laminated film of Example 10 was determined to have a pattern shape with a stripe width W of 25 μm, a stripe space S of 25 μm and a length L of 40 mm. The film composition and film structure are shown in Table 2. The obtained magnetic film was measured for magnetic properties to find that a saturation magnetic field Ms was 1.1 T, an anisotropy field Hk was 10.0×10$^4$ A/m, and a ferromagnetic resonance frequency fr was 6600 MHz. Frequency dependencies of μ' and μ" of the magnetic film were also measured to find that the μ' of the magnetic film at 2 GHz was low to 9.2.

TABLE 2

| | Film composition | | Film structure | | | | Heat treatment |
|---|---|---|---|---|---|---|---|
| | Target composition | Quantity of SiO$_2$ chips | Film shape W (μm) | S (μm) | L (mm) | Film thickness (μm) | Laminated number (one side) | in magnetic field |
| Ex. 1 | Fe$_{50}$Co$_{35}$B$_{15}$ | 20 | (Solid film) | | | 0.5 | 2 | No |
| Ex. 2 | Fe$_{50}$Co$_{35}$B$_{15}$ | 20 | (Solid film) | | | 0.5 | 2 | Yes |
| Ex. 3 | Fe$_{50}$Co$_{35}$B$_{15}$ | 20 | (Solid film) | | | 0.3 | 2 | No |
| Ex. 4 | Fe$_{50}$Co$_{35}$B$_{15}$ | 20 | (Solid film) | | | 0.5 | 3 | No |
| Ex. 5 | Fe$_{50}$Co$_{35}$B$_{15}$ | 20 | (Solid film) | | | 0.5 | 1 | No |
| Ex. 6 | Fe$_{50}$Co$_{35}$B$_{15}$ | 20 | 75 | 25 | 40 | 0.5 | 2 | No |
| Ex. 7 | Fe$_{68}$Co$_{17}$Zr$_{15}$ | 20 | 15 | 5 | 40 | 0.5 | 4 | No |
| Ex. 8 | Fe$_{68}$Co$_{17}$Zr$_{15}$ | 20 | 15 | 5 | 40 | 0.5 | 4 | Yes |
| Ex. 9 | Fe$_{68}$Co$_{17}$Zr$_{15}$ | 20 | 15 | 5 | 40 | 0.5 | 2 | No |
| Ex. 10 | Fe$_{80}$Co$_{20}$ | — | 75 | 25 | 40 | 0.5 | 4 | No |
| Ex. 11 | Fe$_{80}$Co$_{20}$ | — | 75 | 25 | 40 | 1.0 | 4 | No |
| Ex. 12 | Fe$_{80}$Co$_{20}$ | — | 25 | 10 | 40 | 0.5 | 4 | No |
| C. Ex. 1 | Co$_{55}$Fe$_{30}$B$_{15}$ | 15 | (Solid film) | | | 0.5 | 4 | No |
| C. Ex. 2 | Fe$_{80}$Co$_{20}$ | — | 75 | 25 | 40 | 1.5 | 4 | No |
| C. Ex. 3 | Fe$_{80}$Co$_{20}$ | — | 25 | 25 | 40 | 0.5 | 4 | No |

Ex. = Example,
C. Ex. = Comparative Example

The electromagnetic interference preventing components 18 each having the individual high-permeability magnetic film of Examples 1 to 15 described above were cut into a shape of 20 mm×5 mm and a shape of 40 mm×5 mm. They were adhered onto the antenna wiring near the antenna 16 of the cellular phone 10 such that the axial direction of easy magnetization of the high-permeability magnetic film became parallel to the substrate wiring pattern as shown in FIG. 1 and FIG. 2. Such cellular phones were measured for a SAR intensity reducing effect and an antenna efficiency improving effect. The individual laminated magnetic films of Comparative Examples 1 to 3 were also measured in the same manner.

For a SAR intensity reducing effect, an electric field intensity distribution excited within a uniform simulated structure model using a SAM phantom was measured by an electric field probe. For the antenna efficiency improving effect (electromagnetic strength improving effect), electric field intensity of the air other than the SAM phantom was also measured by using the electric field probe. The transmit frequency was 2 GHz for the above measurements. The measured results are shown in Table 3.

TABLE 3

| | Magnetic properties | | | | | | Reduction of SAR intensity (dB) | Improvement of electromagnetic strength (dB) |
|---|---|---|---|---|---|---|---|---|
| | Ms (T) | Hk (×10$^4$ A/m) | μ' at 2 GHz | μ" at 2 GHz | μ"/μ' | fr (MHz) | | |
| Ex. 1 | 1.4 | 3.0 | 40 | 3.00 | 0.08 | 3500 | 3.2 | 2.2 |
| Ex. 2 | 1.4 | 4.0 | 29 | 1.24 | 0.04 | 3700 | 2.5 | 2.3 |
| Ex. 3 | 1.4 | 3.0 | 45 | 2.17 | 0.05 | 3600 | 2.6 | 2.0 |
| Ex. 4 | 1.4 | 3.0 | 40 | 3.00 | 0.08 | 3500 | 3.4 | 2.5 |
| Ex. 5 | 1.4 | 3.0 | 40 | 3.00 | 0.08 | 3500 | 1.4 | 0.8 |
| Ex. 6 | 1.1 | 4.8 | 28 | 0.55 | 0.02 | 4000 | 2.0 | 1.9 |
| Ex. 7 | 1.3 | 3.5 | 24 | 1.60 | 0.05 | 3500 | 2.4 | 2.0 |
| Ex. 8 | 1.3 | 6.0 | 16 | 0.63 | 0.03 | 4400 | 1.8 | 2.0 |
| Ex. 9 | 1.3 | 3.5 | 24 | 1.60 | 0.05 | 3500 | 1.6 | 1.2 |
| Ex. 10 | 1.7 | 2.8 | 52 | 4.66 | 0.09 | 3500 | 3.4 | 2.5 |
| Ex. 11 | 1.7 | 5.2 | 32 | 3.15 | 0.10 | 4600 | 3.2 | 1.9 |
| Ex. 12 | 1.7 | 10.0 | 15 | 0.63 | 0.04 | 6600 | 1.8 | 1.9 |
| C. Ex. 1 | 1.5 | 2.0 | 64 | 11.0 | 0.17 | 2200 | 3.6 | 0.6 |
| C. Ex. 2 | 1.7 | 6.9 | 21.5 | 4.76 | 0.22 | 5400 | 2.1 | 0.4 |
| C. Ex. 3 | 1.1 | 10.0 | 9.2 | 0.41 | 0.04 | 6600 | 0.9 | 0.6 |

Ex. = Example,
C. Ex. = Comparative Example

It is apparent from Table 3 that when the high-permeability magnetic film in high-frequencys of the individual Examples are used, the electric field intensity within the SAM phantom is decreased, and the antenna efficiency of the air other than the SAM phantom is improved. The SAR intensity reducing effect and the antenna efficiency improving effect can be obtained by using either the induced magnetic anisotropy or the shape magnetic anisotropy. In addition, it is seen that the μ' of the high-permeability magnetic film at a transmission band frequency is 15 or more and preferably 30 or more, and the ferromagnetic resonance frequency fr is preferably two times or more of the transmission band frequency.

For example, the electric field intensity within the SAM phantom was decreased by 3.2 dB and the antenna efficiency of the air other than the SAM phantom was improved by 2.2 dB in Example 1. In comparison with Example 1, Example 5 in which the total film thickness of the magnetic film was decreased was somewhat poor in the SAR intensity reducing effect and the antenna efficiency improving effect. Therefore, it is desirable that a total film thickness of the magnetic film is increased based on the laminated number of the magnetic layers. It is apparent from the comparison of Example 10, Example 11 and Comparative Example 2 that the μ" becomes large if the single-layer film thickness of the magnetic layer is increased excessively. Therefore, the single-layer film thickness of the magnetic layer is preferably 1 μm or less. And, it is apparent from the comparison of Example 10, Example 12 and Comparative Example 3 that the stripe shape is preferably adjusted to have an appropriate stripe width W and stripe space S.

Meanwhile, in a case where the laminated magnetic film of Comparative Example 1 was used, the electric field intensity within the SAM phantom was decreased by 2.8 dB, but the antenna efficiency was not improved substantially. It was because the laminated magnetic film of Comparative Example 1 had a large μ"/μ' ratio of 0.17 at 2 GHz, and a heat loss of electromagnetic waves by the laminated magnetic film became large. The same was also applied to the laminated magnetic film of Comparative Example 2. The laminated magnetic film of Comparative Example 3 had a small μ"/μ' ratio, but the μ' at 2 GHz was small to 9.2, so that the electric field intensity within the SAM phantom was merely reduced by 0.7 dB. Then, useful SAR measures cannot be realized.

The invention is not limited to the embodiments described above. Although the examples of applying the electronic device of the invention to the cellular phone were described in the embodiments described above, the invention is not limited to the described embodiments but can be applied to various types of portable communication devices. The invention can be applied to various types of electronic devices having an electromagnetic wave transmitting function. In addition, various modifications and variations of the embodiments of the invention may be made within the technical scope of the present invention. And, the modified or altered embodiments are also included in the technical scope of the present invention.

INDUSTRIAL APPLICABILITY

The electromagnetic interference preventing component according to the embodiments of the invention is effectively used for electromagnetic wave measures of various types of electronic devices having an electromagnetic wave transmitting function. According to the electromagnetic interference preventing component of the embodiments of the invention, the electromagnetic field intensity of the radiated electromagnetic waves in unnecessary directions can be reduced while suppressing the deterioration of the transmission signal strength. Therefore, the electronic device using the electromagnetic interference preventing component can decrease effects of electromagnetic waves on, for example, a human body, other electronic parts and electronic devices while keeping good communication characteristics of the electromagnetic waves.

What is claimed is:

1. An electromagnetic interference preventing component which is mounted on an electronic device having an electromagnetic wave transmitting function, comprising:
    a high-permeability magnetic film in high-frequency having a complex relative permeability μ at a transmission band frequency of the electronic device determined to have a real number component μ' and an imaginary component μ",
    wherein the μ' is 10 or more, tan δ (=μ"/μ') is 0.1 or less, and a ferromagnetic resonance frequency of the high-permeability magnetic film is 1.5 times or more of the transmission band frequency.

2. The electromagnetic interference preventing component according to claim 1,
    wherein the μ' of the high-permeability magnetic film at the transmission band frequency is 15 or more.

3. The electromagnetic interference preventing component according to claim 1,
    wherein the μ' of the high-permeability magnetic film at the transmission band frequency is 30 or more.

4. The electromagnetic interference preventing component according to claim 1,
    wherein the ferromagnetic resonance frequency of the high-permeability magnetic film is two times or more of the transmission band frequency.

5. The electromagnetic interference preventing component according to claim 1,
    wherein the high-permeability magnetic film has a composition represented by the general formula:

$(T_xA_{100-x})_{100-y}D_y$ where, T is at least one element selected from Fe, Co and Ni, A is at least one element selected from B, C, Si, P, Ge and Zr, D is a grain boundary substance composed of an oxide of at least one element M1 selected from Si, Al, Zr and Hf or a nitride of at least one element M2 selected from Si and Al, and x and y are numbers meeting $50 \leq x \leq 100$ (atomic %) and $0 \leq y < 50$ (atomic %).

6. The electromagnetic interference preventing component according to claim 1,
    wherein the high-permeability magnetic film includes a laminated film which has plural magnetic layers laminated via a nonmagnetic insulating layer.

7. The electromagnetic interference preventing component according to claim 6,
    wherein each of the plural magnetic layers has a thickness of 1 μm or less.

8. The electromagnetic interference preventing component according to claim 6,
    wherein the magnetic film thickness of the laminated film, which corresponds to a total sum of the single-layer film thicknesses of the plural magnetic layers, is larger than 1 μm.

9. The electromagnetic interference preventing component according to claim 1,
    wherein the high-permeability magnetic film has an anisotropy field mainly based on an induced magnetic anisotropy.

10. The electromagnetic interference preventing component according to claim 9,
    wherein the high-permeability magnetic film has a composition represented by the general formula:

$(T_xA_{100-x})_{100-y}D_y$ where, T is at least one element selected from Fe, Co and Ni, A is at least one element selected from B, C, Si, P, Ge and Zr, D is a grain boundary substance composed of an oxide of at least one element M1 selected from Si, Al, Zr and Hf or a nitride of at least one element M2 selected from Si and Al, and x and y are numbers meeting $50 \leq x 100$ (atomic %) and $0 \leq y 50$ (atomic %).

11. The electromagnetic interference preventing component according to claim 1,
wherein the high-permeability magnetic film has an anisotropy field mainly based on a shape magnetic anisotropy.

12. The electromagnetic interference preventing component according to claim 11,
wherein the high-permeability magnetic film includes a magnetic film which has a stripe shape with a stripe width in a range of 10 μm to 500 μm and a stripe space in a range of 5 μm to 100 μm.

13. An electronic device, comprising:
an electronic device body including an electromagnetic wave transmitting part, and
an electromagnetic interference preventing component which is disposed to selectively decrease an electromagnetic field intensity in directions, in which electromagnetic waves radiate from the electromagnetic wave transmitting part are not required, the electromagnetic interference preventing component including a high-permeability magnetic film in high-frequency having a complex relative permeability μ at a transmission band frequency of the electronic device body determined to have a real number component μ' and an imaginary component μ",
wherein the μ' is 10 or more, tan δ (=μ"/μ') is 0.1 or less, and a ferromagnetic resonance frequency of the high-permeability magnetic film is 1.5 times or more of the transmission band frequency.

14. The electronic device according to claim 13,
wherein the electronic device is a portable communication device.

15. The electronic device according to claim 13,
wherein the high-permeability magnetic film has a composition represented by the general formula:

$(T_xA_{100-x})_{100-y}D_y$ where, T is at least one element selected from Fe, Co and Ni, A is at least one element selected from B, C, Si, P, Ge and Zr, D is a grain boundary substance composed of an oxide of at least one element M1 selected from Si, Al, Zr and Hf or a nitride of at least one element M2 selected from Si and Al, and x and y are numbers meeting $50 \leq x \leq 100$ (atomic %) and $0 \leq y < 50$ (atomic %).

16. The electronic device according to claim 13,
wherein the high-permeability magnetic film includes a laminated film which has plural magnetic layers laminated via a nonmagnetic insulating layer.

17. The electronic device according to claim 16,
wherein each of the plural magnetic layers has a thickness of 1 μm or less.

18. The electronic device according to claim 16,
wherein the magnetic film thickness of the laminated film, which corresponds to a total sum of the single-layer film thicknesses of the plural magnetic layers, is larger than 1 μm.

19. The electronic device according to claim 13,
wherein the high-permeability magnetic film has an anisotropy field mainly based on an induced magnetic anisotropy.

20. The electronic device according to claim 13,
wherein the high-permeability magnetic film has an anisotropy field mainly based on a shape magnetic anisotropy.

* * * * *